(12) United States Patent
Skoda et al.

(10) Patent No.: US 10,916,352 B2
(45) Date of Patent: Feb. 9, 2021

(54) NUCLEAR REACTOR HAVING A LAYER PROTECTING THE SURFACE OF ZIRCONIUM ALLOYS

(71) Applicants: CZECH TECHNICAL UNIVERSITY IN PRAGUE, FACULTY OF MECHANICAL ENGINEERING, Prague (CZ); INSTITUTE OF PHYSICS OF THE ACADEMY OF SCIENCES OF THE CZECH REPUBLIC, V.V.I., Prague (CZ)

(72) Inventors: Radek Skoda, Liberec (CZ); Jan Skarohlid, Prague (CZ); Irena Kratochvilova, Prague (CZ); Frantisek Fendrych, Prague (CZ); Andrew James Taylor, Zelenec (CZ)

(73) Assignees: CZECH TECHNICAL UNIVERSITY IN PRAGUE, FACULTY OF MECHANICAL ENGINEERING, DEPARTMENT OF ENERGY ENGINEERING, Prague (CZ); INSTITUTE OF PHYSICS OF THE ACADEMY OF SCIENCE OF THE CZECH REPUBLIC, V.V.I., Prague (CZ)

( * ) Notice: Subject to any disclaimer, the term of this patent is extended or adjusted under 35 U.S.C. 154(b) by 181 days.

(21) Appl. No.: 16/186,504

(22) Filed: Nov. 10, 2018

(65) Prior Publication Data
US 2019/0080806 A1 Mar. 14, 2019

Related U.S. Application Data

(63) Continuation of application No. 15/022,536, filed as application No. PCT/CZ2014/000101 on Sep. 16, 2014, now abandoned.

(30) Foreign Application Priority Data

Sep. 20, 2013 (CZ) .................................. 2013-727

(51) Int. Cl.
*G21C 3/07* (2006.01)
*C23C 16/27* (2006.01)
(Continued)

(52) U.S. Cl.
CPC ................ *G21C 3/07* (2013.01); *C23C 16/27* (2013.01); *G21C 17/0225* (2013.01); *G21C 21/00* (2013.01); *G21C 3/34* (2013.01)

(58) Field of Classification Search
CPC ........ G21C 3/07; G21C 17/0225; G21C 3/34; G21C 21/00; C23C 16/27
(Continued)

(56) References Cited

U.S. PATENT DOCUMENTS 5,434,896 A * 7/1995 Bryan ..................... G21C 3/07
376/414
10,679,829 B1 * 6/2020 Gorokhovsky ..... H01J 37/3244
(Continued)

FOREIGN PATENT DOCUMENTS

JP 60-43483 A * 3/1985 ........... C23C 16/271

OTHER PUBLICATIONS

Fendrych, "Growth and characterization of nanodiamond layers prepared using the plasma-enhanced linear antennas microwave CVD system", Journal of Physics D: Applied Physics 43, No. 37 (2010): 374018. (Year: 2010).*
(Continued)

*Primary Examiner* — Jack W Keith
*Assistant Examiner* — Daniel Wasil
(74) *Attorney, Agent, or Firm* — WRB-IP LLP

(57) ABSTRACT

A layer protecting the surface of zirconium alloys used as materials for nuclear reactors is formed by a homogenous
(Continued)

polycrystalline diamond layer prepared by chemical vapor deposition method. This diamond layer is 100 nm to 50 μm thick and the size of the crystalline cores in the layer ranges from 10 nm to 500 nm. Maximum content of non-diamond carbon is 25 mol %, total content of non-carbon impurities is maximum up to 0.5 mol %, RMS surface roughness of the polycrystalline diamond layer has a value less than 40 nm and thermal conductivity of the layer ranges from 1000 to 1900 W⊙m$^{-1}$⊙K$^{-1}$. Coating of the zirconium alloys surface with the described polycrystalline diamond layer serves as a zirconium alloys surface protection against undesirable changes and processes in the nuclear reactor environment.

7 Claims, 2 Drawing Sheets

(51) Int. Cl.
  *G21C 21/00* (2006.01)
  *G21C 17/022* (2006.01)
  *G21C 3/34* (2006.01)

(58) Field of Classification Search
  USPC .................................................. 376/414, 457
  See application file for complete search history.

(56) References Cited

U.S. PATENT DOCUMENTS

2009/0214826 A1* 8/2009 West ........................ B24D 3/10
  428/141
2013/0306989 A1* 11/2013 Kub .................... C23C 14/0641
  257/77

OTHER PUBLICATIONS

Wort, "Thermal properties of bulk polycrystalline CVD diamond", Diamond and Related Materials 3, No. 9 (1994): 1158-1167. (Year: 1994).*

* cited by examiner

NUCLEAR REACTOR HAVING A LAYER PROTECTING THE SURFACE OF ZIRCONIUM ALLOYS

The present application is a continuation of U.S. patent application Ser. No. 15/022,536, filed Mar. 16, 2016, which is the U.S. national stage of International Application PCT/CZ2014/000101, filed Sep. 16, 2014, which claims priority to Czech Republic App. PV 2013-727, filed Sep. 20, 2013, all of which are incorporated by reference.

BACKGROUND OF THE INVENTION

The presented solution deals with the protection of zirconium alloys surface against undesirable changes and processes in light-water and heavy-water nuclear reactors.

DESCRIPTION OF PRIOR ART

Now, zirconium alloys are present in all commercially operated power producing light-water (PWR, BWR, WER) and heavy-water (CANDU) nuclear reactors. In particular Zirconium alloys are used as a material for nuclear fuel rods and also for other structural elements in fuel assemblies and the core of nuclear reactors, such as spacer grids or complete pressure channels. The reason for their use is mainly the low parasitic absorption of neutrons and high resistance against radiation damage. Zirconium alloys also feature very good mechanical properties and corrosion stability, which are maintained even during long-term exposure to extreme conditions produced in nuclear reactors, especially high neutron flux, high pressure and temperature.

Already from the manufacture zirconium alloys have natural thin passivated layer of zirconium dioxide with a thickness of about 3-5 µm. This thin oxide layer protects the alloy itself from further oxidation. The oxidation rate is limited by the rate of oxygen diffusion through the passivated layer of $ZrO_2$. At the end of the campaign, it is the end of the residence time of fuel in a nuclear reactor, the oxide layer thickness is about 20 µm, depending on the reactor type, the type of alloy, the quality of water during operation and the burnout degree. [P. C. Burns, R. et al, Science, 335:1184-1188 (2012); R. A. Causey et al Sandia National Laboratory Report SAND2005-6006 (2006); Vujic et al ENERGY, Small modular reactors: Simpler, safer, cheaper (2012), 45, 288; S. A. Brown, ASTM Spec. Tech. Publ., 780, Westminster, Pa. (1981); M. P. Puls, Metallurgical & Materials Transactions, (1990), 21, 2905; Dostal V et al Progress in Nuclear Energy, (2008), 50, 631; K. M. Song and S. B. Lee, Journal of Power and Energy Systems, (2008), 2, 47;M. Steinbruk, Oxid. Metals, DOI: 10.1007/s11085-011-9249-3 (2011)].

Normal operating temperatures in the reactor is about 300° C. approx. In case of some accident may at temperatures above 800° C. so called High Temperature Corrosion begins, in this case the peeling of the oxide layer previously protecting the metal from oxidation occurs, this can result in mechanical failure of the system. It is strongly exothermic and high auto-catalytic reaction between zirconium and steam, during which the dissociation of steam molecules occurs and cause formation of zirconium dioxide, hydrogen, and releases a large amount of heat Result of the reaction is not only the formation of hydrogen, which, as a combustible gas, is a serious risk in the case of a severe accident, but also release large quantities of heat, which further complicates the core cooling and strengthens the further course of the High-temperature oxidation of zirconium alloys. Finally, there is also the degradation of the fuel cladding, one of the protective barriers, that may lead to its failure and subsequent leakage of highly radioactive fission products from nuclear fuel into the primary circuit. In case of flooding of the superheated active zone with water, which is one of the functions of the safety systems in nuclear reactors, quenching of a zirconium alloy occurs. Production of hydrogen in this case is ten times higher as compared to cases where cladding reacts only with steam. Temperature is the most important factors affecting High-temperature corrosion, because reaction kinetics increases with increasing temperature. Other influencing factors are: exposure time of hot alloy in air, which leads to the formation of zirconium nitride, and then in case of reaction with steam leads to intensive release heat, the initial oxidation of the zirconium alloy, which is directly proportional to the residence time in the reactor, the presence of other materials in the melting core and more.

SUMMARY OF THE INVENTION

The weaknesses mentioned above are removed by coating zirconium alloys used in nuclear reactors with a protective layer formed by homogenous polycrystalline diamond layer prepared by the chemical vapor deposition method. This diamond layer is 100 nm to 50 µm thick where the size of crystalline is ranging from 10 nm to 500 nm. The maximum content of non-diamond carbon is 25 mol %, total content of non-carbon impurities is up to a maximum of 0.5 mol %, RMS surface roughness of the polycrystalline diamond layer has a value less than 40 nm and thermal conductivity of the layer ranges from 1000 to 1900 $W \cdot m^{-1} \cdot K^{-}$.

By applying a homogenous polycrystalline diamond layer, materials made from zirconium alloys are protected against undesirable changes and processes in the nuclear reactor environment. The polycrystalline diamond layer protects the surface of the zirconium alloy against high-temperature corrosion, which involves peeling the protective oxide layer and subsequently mechanical failure of the entire system. The layer of polycrystalline diamond will prevent also the reaction between zirconium and water steam. During such reaction water steam molecules dissociate and subsequently zirconium oxide and hydrogen are formed whilst huge amounts of heat are generated. The protective layer therefore prevents the formation of hydrogen, which being an explosive gas is a serious hazard in the case of a severe accident. Simultaneously it also prevents the generation of increased amounts of reaction heat that would further complicate active zone cooling and intensify, further, the process of zirconium alloy oxidation.

EXPLANATION OF DRAWINGS

The presented solution is illustrated by FIG. 1 and FIG. 2 showing the Raman spectrum of the homogenous polycrystalline diamond layer covering the sample of the fuel element made of zirconium alloy both in the basic condition and after simulation of standard as well as emergency conditions of the nuclear reactor.

DETAILED DESCRIPTION OF THE PREFERRED EMBODIMENTS

Figure 1:
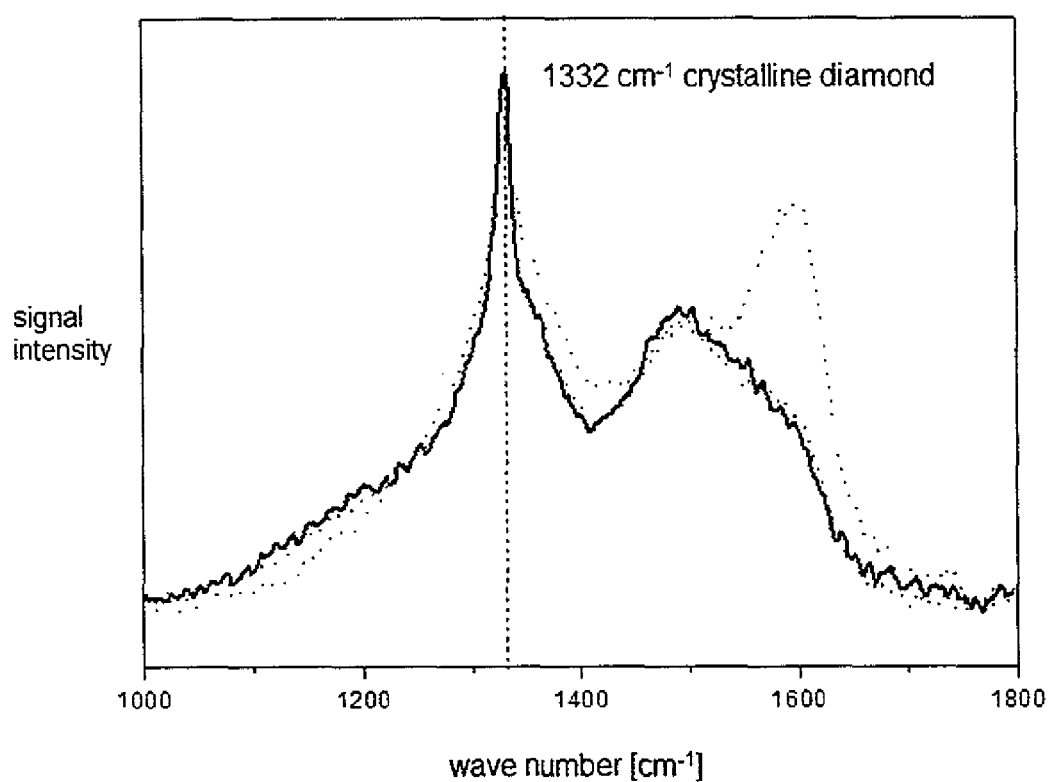
In FIG. 1 peaks of Raman spectra show vibrational states of various phases of carbon protective layer.

The proposed solution and the subject of this patent is the protection of the surface of zirconium alloys used as materials in nuclear reactors by polycrystalline diamond layers. Diamond features high thermal conductivity and stability, low chemical reactivity, it does not degrade over time and has a suitable effective cross-section for interaction with neutrons. The surface of elements made of zirconium alloys are coated with homogenous polycrystalline diamond layers prepared by chemical vapor deposition method, abbreviated as CVD, with typical columnar nature of diamond crystallites. The CVD method means that diamond is prepared by decomposition of a mixture of methane (or other carbon containing species) and at pressures from 0.01 mbar to 100 mbar and at substrate temperatures of 250° C. to 1000° C.

Polycrystalline diamond layers suitable for the protection of zirconium alloys surface is 100 nm to 50 µm thick and with crystalline cores in the layer ranges from 10 nm to 500 nm in size. From the chemical composition point of view the layer can be specified based on the maximum content of non-diamond carbon, which is a maximum 25 mol %, and by the total content of non-diamond impurities with a maximum value of up to 0.5 mol %. Surface roughness of the polycrystalline diamond layer must not exceed the RMS roughness value of 40 nm. Thermal conductivity of the layer ranges from 1000 to 1900 $W \cdot m^{-1} \cdot K^{-1}$.

Crystalline diamond has a strong and rigid isotropic structure due to its cubic crystal symmetry—carbon atoms are bound by strong covalent bonds. On the contrary, carbon atoms in graphite are bound by different σ and π bonds in the hexagonal crystal system. In this specific configuration, one electron is weakly bounded and thus contributes to a significantly higher electrical conductivity of graphite compared to diamond. Stable planar structures of graphite are mutually bonded by Van der Waals forces, thereby forming the soft, malleable and also resistant material.

Under standard operation conditions in nuclear reactors the polycrystalline diamond layer will maintain its original properties and will participate both in dissipation of heat released during the reactor's operating mode, and also will protect the coated surface against undesirable chemical reactions and changes of the structure composition related to diffusion of the hydrogen atoms from dissociated molecules of water into the zirconium alloy. After long-term interaction with elementary particles released from the nuclear reactions the polycrystalline diamond layer shows partial graphitization and amorphization but the diamond crystalline phase is still present in the layer. Polycrystalline diamond layer will further limit the undesirable high-temperature chemical reactivity of the zirconium alloys surface and therefore also the high-temperature dissociation of water steam molecules and subsequent formation of the zirconium oxide and explosive hydrogen. In the case of temperature-induced changes of the zirconium tubes volume, the layer will benefit from the mixed nature of the protective carbon layer, which besides crystalline diamond cores with $sp^3$ of hybridized carbon contains also flexible amorphous phase $sp^2$ from hybridized carbon capable of good adaptation to the volume changes/expansion of the metal substrate without disrupting the protective layer integrity.

If under accident conditions in the nuclear reactor the system gets heated above temperature of 850° C., the protective polycrystalline diamond layer undergoes a phase change. Crystalline diamond transforms into a mixture of crystalline graphite, graphene and amorphous carbon. Non-diamond carbon material, or its selected components feature a high melting temperature of 3642° C. The process of the crystalline diamond thermal transformation to graphite, graphene and non-s crystalline carbon consumes part of the energy from the environment, thus also at least slightly lowering its temperature. This protection, carbon-containing layer further worsen the conditions for the high temperature degeneration of the surface, including the passivated layer, also any quenching of zirconium alloy and further reduces the probability of explosion of hydrogen.

Below is an example showing the practical impact of the use of protective homogeneous polycrystalline diamond layer on zirconium samples, FIG. 1 and FIG. 2.

Figure 2:
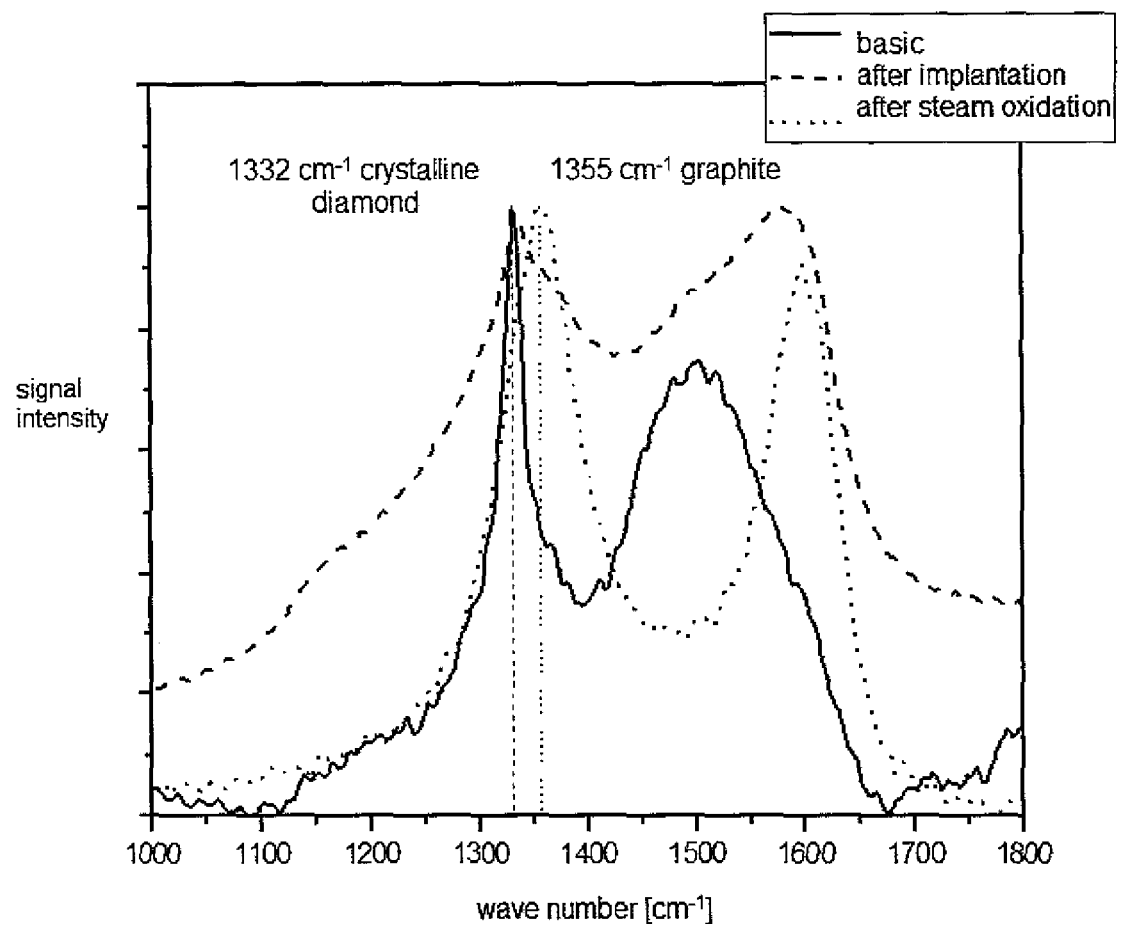
FIG. 2 shows that after ion implantation, simulating material interaction with particles in a nuclear reactor, the polycrystalline diamond layer underwent partial graphitization but the diamond crystalline phase in the layer was still present. After simulation at accident conditions, i.e. exposure to hot water steam, a phase change in the protective layer occurred.

Raman spectra of the sample of the fuel cell made from a zirconium alloy, homogeneously coated by 300 nm thick polycrystalline diamond film by vapor deposition is shown in FIG. 1. All the Raman spectra were measured at different locations on the surface to prove the regularity of the sample state. Raman peak positions in spectra were same at different locations on the sample surface. The vibration peak at 1332 $cm^{-1}$ corresponds to the $sp^3$ hybridized carbon, that means the diamond phase in layer. Vibrations in the range of 1450-1650 $cm^{-1}$ correspond to the $sp^2$ hybridized carbon, thus non-diamond phase represented in the polycrystalline diamond layer.

The partial graphitization of polycrystalline diamond films was obtained after ion implantation, simulating the load of material interactions with elementary particles in a nuclear reactor for the 3 MeV Fe ions, the dose of $1.95 \times 10^{16}$ $cm^{-2}$, as corresponding to 10 dpa damage. But diamond crystalline phase was still present in the layer, see the Raman spectrum, FIG. 2. FIG. 2 shows the Raman spectra of a homogeneous polycrystalline diamond layer covering a portion of the fuel cell of the zirconium alloy in a basic condition, after ion implantation, and heated in a steam environment at a temperature of 1100-1200° C. The vibration peak at 1332 $cm^{-1}$ corresponds to the $sp^3$ hybridized carbon, thus the diamond phase of carbon, the vibration peak at 1355 $cm^{-1}$ to the crystalline graphite, vibrations in the range of 1450 to 1650 $cm^{-1}$ to the $sp^2$ hybridized carbon, thus non-diamond carbon phase The Raman spectrum line of the sample coated with the polycrystalline diamond layer is shown in FIG. 2 by the full line.

Dashed line shows the spectrum of the sample coated with the polycrystalline diamond layer after ion implantation simulating the load of material by interaction with fundamental particles in a nuclear reactor. Ion implantation causes partial graphitization of the polycrystalline diamond layer but the diamond crystalline phase remains still present in the layer.

Dotted line shows the Raman spectrum of the sample coated with the polycrystalline diamond layer after simulation of accident conditions by steam oxidation when the phase change of the crystalline diamond in the protective layer occurs and the crystalline diamond transforms into the mixture of graphite, graphene and amorphous carbon.

It is evident, that after the simulation of accident conditions in a nuclear reactor, therefore heating in a steam environment at a temperature in the range 1100 to 1200° C., the phase change occurs in the protective layer. Crystalline diamond has transformed into a mixture of graphite, graphene and amorphous carbon.

Elemental analysis, of the substrate and the protective layer in its initial state and after the thermal stress in the steam chamber, where the simulated environment of a nuclear reactor accident at 1100-1200° C. was made by ESCA, Electron Spectroscopy for Chemical Analysis. It was found that thermally transformed carbon layer comprises a mixtures of carbon, oxygen and atoms of substrate. The newly composed layer thus absorbed atoms from surroundings and separated zirconium alloy surface from the surrounding environment so that its status under the protective layer from the base material Zr alloys atomic composition differed minimally.

INDUSTRIAL APPLICABILITY

The above mentioned protection of zirconium alloys surfaces by homogenous polycrystalline diamond layers may be applied to a wide range of functional elements for nuclear reactors, such as fuel rod elements. This involves, in particular, parts of commercially operated power producing light-water reactors PWR, BWR, VVER and heavy-water reactors CANDU. The described protective layer significantly increases such reactors' operation safety.

The invention claim is:

1. A nuclear reactor, comprising:
a nuclear fuel rod comprising a zirconium alloy tube;
cladding on the nuclear fuel rod,
    the cladding comprising a layer coated on an outer surface of the zirconium alloy tube,
wherein, under standard operating conditions that include a temperature of about 300° C., the layer
    comprises a homogenous polycrystalline diamond layer formed by chemical vapor deposition,
    is from 100 nm to 50 μm thick,
    includes crystalline cores, sizes thereof being in the range from 10 nm to 500 nm,
    has a maximum content of non-diamond carbon of 25 mol %,
    has a maximum total content of non-carbon impurities of 0.5 mol %,
    has a RMS surface roughness value less than 40 nm, and
    has a thermal conductivity of the layer ranges from 1000 to 1900 $W \cdot m^{-1} \cdot K^{-1}$, and
wherein, when the nuclear reactor is operated at a temperature above 850° C., the polycrystalline diamond layer undergoes a phase change and is transformed into a mixture of crystalline graphite, amorphous carbon, and graphene,
    wherein the transformation is configured to consume environment energy to lower environment temperature.

2. The nuclear reactor as set forth in claim 1, wherein the mixture forms a carbide.

3. The nuclear reactor as set forth in claim 1, wherein, after operation at a temperature above 1100° C., a thermally transformed carbon layer comprises a mixture of carbon, oxygen, and atoms from the zirconium alloy tube.

4. A method of protecting a nuclear reactor against corrosion, comprising:
providing in the nuclear reactor a nuclear fuel rod comprising a zirconium alloy tube;
providing cladding on the nuclear fuel rod,
    the cladding comprising a layer coated on an outer surface of the zirconium alloy tube,
wherein, under standard operating conditions that include a temperature of about 300° C., the layer
    comprises a homogenous polycrystalline diamond layer formed by chemical vapor deposition,
    is from 100 nm to 50 μm thick,
    includes crystalline cores, sizes thereof being in the range from 10 nm to 500 nm,
    has a maximum content of non-diamond carbon of 25 mol %,
    has a maximum total content of non-carbon impurities of 0.5 mol %,
    has a RMS surface roughness value less than 40 nm, and
    has a thermal conductivity of the layer ranges from 1000 to 1900 $W \cdot m^{-1} \cdot K^{-1}$;
wherein, when the nuclear reactor is operated at a temperature above 850° C., the polycrystalline diamond layer undergoes a phase change and is transformed into a mixture of crystalline graphite, graphene, amorphous carbon, and atoms from the zirconium alloy tube,
    wherein the transformation is configured to consume environment energy to lower environment temperature,
operating the nuclear reactor so that the polycrystalline diamond layer is still present and shows partial graphitization and amorphization.

5. The method as set forth in claim 4, comprising operating the nuclear reactor at a temperature above standard operating conditions so that the polycrystalline diamond layer undergoes a phase change and is transformed into a mixture of crystalline graphite, graphene, amorphous carbon, and atoms from the zirconium alloy tube.

6. The method as set forth in claim 5, wherein the mixture includes a carbide.

7. The method as set forth in claim 5, wherein the temperature above standard operating conditions is above 850° C.

* * * * *